US009547402B2

(12) United States Patent
An (10) Patent No.: US 9,547,402 B2
(45) Date of Patent: Jan. 17, 2017

(54) DISPLAY DEVICE WITH TOUCH SENSOR (71) Applicant: SAMSUNG DISPLAY CO., LTD., Yongin, Gyeonggi-Do (KR)

(72) Inventor: Chi Wook An, Hwaseong-si (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 119 days.

(21) Appl. No.: 14/645,645

(22) Filed: Mar. 12, 2015

(65) Prior Publication Data

US 2016/0103516 A1 Apr. 14, 2016

(30) Foreign Application Priority Data

Oct. 13, 2014 (KR) .................. 10-2014-0137546

(51) Int. Cl.
G06F 3/045 (2006.01)
G06F 3/044 (2006.01)
H01L 27/32 (2006.01)
H01L 51/52 (2006.01)

(52) U.S. Cl.
CPC ............ *G06F 3/044* (2013.01); *H01L 27/323* (2013.01); *H01L 27/3211* (2013.01); *H01L 51/5256* (2013.01); *H01L 51/5265* (2013.01)

(58) Field of Classification Search
CPC G06F 3/041; G06F 3/044; G06F 2203/04111; G06F 2203/04112; H01L 27/3211; H01L 27/323; H01L 51/524; H01L 51/5256
See application file for complete search history.

(56) References Cited

U.S. PATENT DOCUMENTS

| 8,519,413 | B2* | 8/2013 | Jeong | H01L 27/3211 257/79 |
| 8,716,931 | B2* | 5/2014 | Lhee | H01L 27/3211 313/504 |
| 8,963,848 | B2* | 2/2015 | Choi | G06F 3/044 345/173 |
| 2007/0159094 | A1* | 7/2007 | Oh | H01L 27/3223 313/512 |
| 2011/0241038 | A1* | 10/2011 | Kashiwabara | H01L 27/3211 257/89 |
| 2012/0001206 | A1* | 1/2012 | Jeong | H01L 51/5215 257/89 |

(Continued)

FOREIGN PATENT DOCUMENTS

JP 2013-225195 A 10/2013
KR 10-2013-0036741 A 4/2013

(Continued)

*Primary Examiner* — Joe H Cheng
(74) *Attorney, Agent, or Firm* — Lee & Morse P.C.

(57) ABSTRACT

A display device includes a substrate, a display unit on the substrate, the display unit including a first emission layer, a second emission layer, and a third emission layer having different emission colors, a sealing part covering and sealing the display unit, and a touch sensor on the sealing part, the touch sensor including a detection electrode adjacent to the first emission layer, the second emission layer, and the third emission layer, and the detection electrode maintaining different distances from each of the first emission layer, the second emission layer, and the third emission layer in a surface direction of the substrate.

20 Claims, 10 Drawing Sheets (56) References Cited

U.S. PATENT DOCUMENTS

| | | | |
|---|---|---|---|
| 2014/0055028 A1* | 2/2014 | Yi | H05B 33/04 |
| | | | 313/498 |
| 2014/0218335 A1* | 8/2014 | Teranishi | G06F 3/044 |
| | | | 345/174 |
| 2015/0015538 A1* | 1/2015 | Tanaka | G06F 3/044 |
| | | | 345/174 |
| 2015/0378494 A1* | 12/2015 | Cok | G06F 3/0416 |
| | | | 345/174 |

FOREIGN PATENT DOCUMENTS

| | | |
|---|---|---|
| KR | 10-2013-0063971 A | 6/2013 |
| KR | 10-1373044 B1 | 3/2014 |
| KR | 10-2014-0052145 A | 5/2014 |

* cited by examiner

DISPLAY DEVICE WITH TOUCH SENSOR

CROSS-REFERENCE TO RELATED APPLICATION

Korean Patent Application No. 10-2014-0137546, filed on Oct. 13, 2014, in the Korean Intellectual Property Office, and entitled: "Display Device with Touch Sensor," is incorporated by reference herein in its entirety.

BACKGROUND

1. Field

The described technology relates generally to a display device including a touch sensor, and more particularly, to a display device capable of restricting deterioration of an image quality according to a change in a viewing angle.

2. Description of the Related Art

A touch sensor provided in a display device provides a touch detecting function capable of interworking with an observer. The touch detecting function recognizes contact information, e.g., whether a touch is generated and a position of a touch, when an observer approaches or contacts a surface of the display device, e.g., by using a finger, a touch pen, and the like, so the display device may receive an image signal based on the contact information and display an image.

For example, a capacitive type touch sensor includes a detection capacitor with a plurality of detection electrodes, detects a change in capacitance of the detection capacitor occurring when a conductor, e.g., a finger, approaches the touch sensor, and recognizes whether a touch is generated by the conductor, a position of a touch, and the like. The touch sensor may be included in the display device in an add-on method or an in-cell (on-cell) method.

SUMMARY

An exemplary embodiment provides a display device, including a substrate, a display unit on the substrate, the display unit including a first emission layer, a second emission layer, and a third emission layer having different emission colors, a sealing part covering and sealing the display unit, and a touch sensor on the sealing part, the touch sensor including a detection electrode adjacent to the first emission layer, the second emission layer, and the third emission layer, and the detection electrode maintaining different distances from each of the first emission layer, the second emission layer, and the third emission layer in a surface direction of the substrate.

The first emission layer, the second emission layer, and the third emission layer may be formed at different heights from the substrate to have different vertical distances from the touch sensor in a thickness direction of the substrate. The first emission layer, the second emission layer, and the third emission layer may be alternately arranged in a first direction of the substrate; and the detection electrode may maintain different distances from the first emission layer, the second emission layer, and the third emission layer in the first direction.

The vertical distance from the touch sensor may be larger in an order of the third emission layer, the second emission layer, and the first emission layer, and the detection electrode may maintain a large distance in an order of the third emission layer, the second emission layer, and the first emission layer in the first direction. The entire detection electrode may be formed with a predetermined width.

The detection electrode may be formed with at least three different widths. The detection electrode may be formed with a width of w1 between the first emission layer and the second emission layer, a width of w2 between the first emission layer and the third emission layer, and a width of w3 between the second emission layer and the third emission layer. The detection electrode may satisfy a condition of $w1>w2>w3$.

The detection electrode may maintain the same distance from two emission layers between the two adjacent emission layers in the first direction. The detection electrode may be positioned closer to any one of two emission layers having a smaller vertical distance from the touch sensor between the two adjacent emission layers in the first direction.

Emission layers having the same color may be arranged in parallel in a second direction which crosses the first direction, and the detection electrode may be formed with different widths between the first emission layers, the second emission layers, and the third emission layers.

The detection electrode may be formed with a width of w11 between the first emission layers, a width of w12 between the second emission layers, and a width of w13 between the third emission layers. The detection electrode may satisfy a condition of $w11>w12>w13$. The detection electrode may maintain the same distance from two emission layers between the two adjacent emission layers in the second direction.

The sealing part may have a laminated structure of at least two inorganic layers and at least one organic layer, and the organic layer may serve as a planarizing layer, and removes a step under the sealing part.

The detection electrode may include: a first detection electrode including a plurality of first detection cells and a plurality of connection patterns; and a second detection electrode including a plurality of second detection cells and a plurality of second connection patterns, and crossing the first detection electrode. The plurality of first detection cells and the plurality of second detection cells may be formed in a mesh shape surrounding each of the first emission layer, the second emission layer, and the third emission layer.

The detection electrode may include at least one selected from the group consisting of silver (Ag), aluminum (Al), copper (Cu), chromium (Cr), nickel (Ni), a silver (Ag) nanowire, and a carbon nanotube.

Another exemplary embodiment provides a display device, including: a substrate; a display unit formed on the substrate, and including a first emission layer, a second emission layer, and a third emission layer having different emission colors; a sealing part configured to cover and seal the display unit; and a touch sensor formed on the sealing part, and including a detection electrode adjacent to the first emission layer, the second emission layer, and the third emission layer. The detection electrode may be formed with different widths around the first emission layer, the second emission layer, and the third emission layer.

The first emission layer, the second emission layer, and the third emission layer may be formed at different heights from the substrate to have different vertical distances from the touch sensor in a thickness direction of the substrate.

The vertical distance from the touch sensor may be large in an order of the third emission layer, the second emission layer, and the first emission layer. The detection electrode may be formed with the smallest width around the third emission layer, and may be formed with the largest width around the first emission layer.

The detection electrode may maintain the same distance from two emission layers between the two adjacent emission layers. The detection electrode may be positioned closer to any one of two emission layers having a smaller vertical distance from the touch sensor between the two adjacent emission layers.

BRIEF DESCRIPTION OF THE DRAWINGS

Features will become apparent to those of ordinary skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

Further, the word "over" or "on" means positioning on or below the object portion, but does not essentially mean positioning on the upper side of the object portion based on a gravity direction. Also, in the specification, unless explicitly described to the contrary, the word "comprise" and variations such as "comprises" or "comprising", will be understood to imply the inclusion of stated elements but not the exclusion of any other elements.

Figure 1:
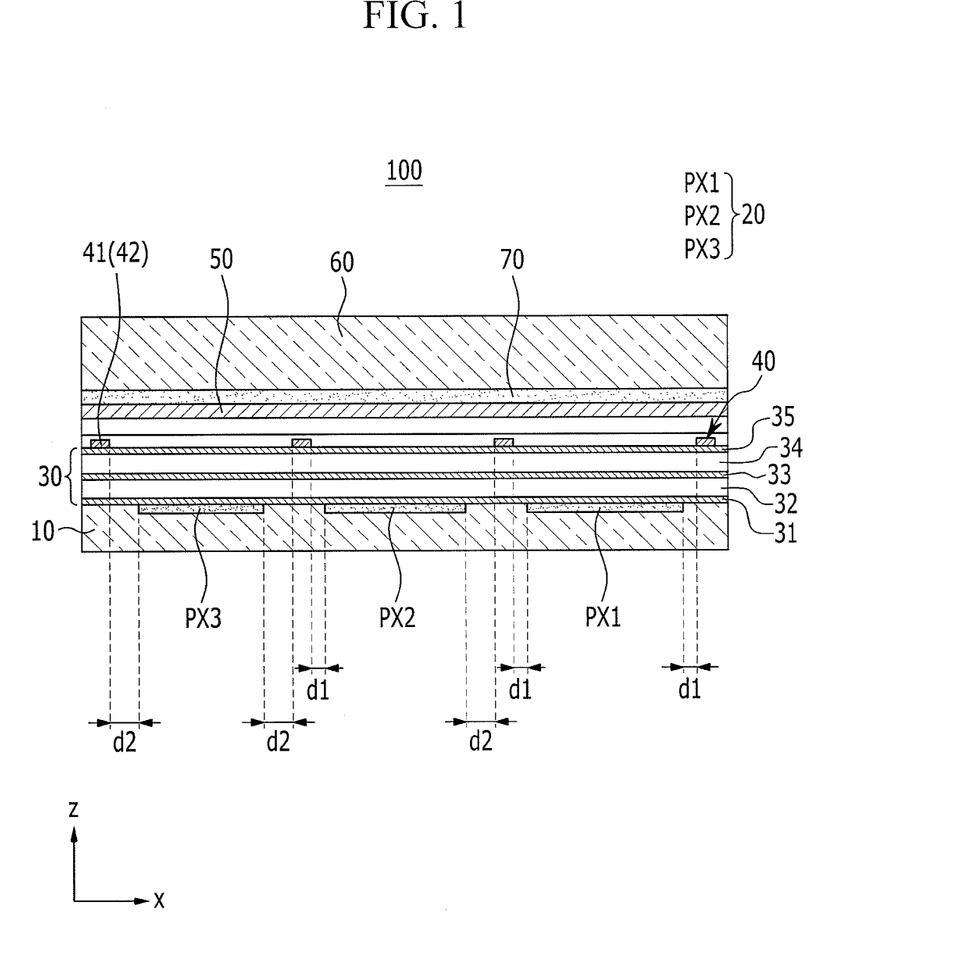
FIG. 1 illustrates a schematic cross-sectional view of a display device according to a first exemplary embodiment.

FIG. 1 is a cross-sectional view schematically illustrating a display device according to a first exemplary embodiment.

Referring to FIG. 1, a display device 100 according to a first exemplary embodiment may include a substrate 10, a display unit 20 including a plurality of pixels PX1, PX2, and PX3, a sealing part 30 for covering and sealing the display unit 20, a touch sensor 40 formed on the sealing part 30, and a cover window 60. The display device 100 may further include a polarizer 50 on or under the touch sensor 40, e.g., FIG. 1 illustrates the polarizer 50 between the touch sensor 40 and the cover window 60.

The touch sensor 40 includes detection electrodes 41 and 42. The detection electrodes 41 and 42 may include parts (first parts) extended in one direction while being adjacent to the pixels PX1, PX2, and PX3, respectively, and further parts (second parts) formed to cross the first parts and surrounding the pixels PX1, PX2, and PX3 together with the first parts, respectively. For example, the detection electrodes 41 and 42 may be formed in a mesh shape surrounding each of the pixels PX1, PX2, and PX3.

The substrate 10 may be an insulating substrate, e.g., at least one of glass, quartz, ceramic, and plastic, or a metal substrate, e.g., stainless steel. Further, the substrate 10 may be formed of a bendable plastic film, and in this case, the display device 100 may have a flexible property by which the display device 100 is easily bendable or foldable. A buffer layer (not illustrated) may be formed on the substrate 10 to prevent impurities from permeating through the substrate 10.

Figure 2:
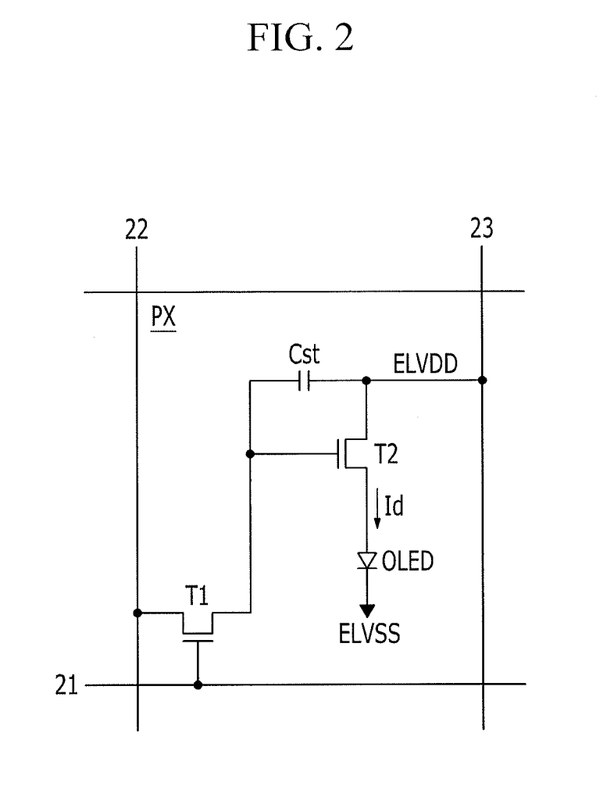
FIG. 2 illustrates an equivalent circuit diagram of a pixel of an organic light emitting display device.

The display unit 20 may be formed on the buffer layer, and includes the plurality of pixels PX1, PX2, and PX3 arranged in an approximate matrix form. The display device 100 may be an organic light emitting display device. FIG. 2 is an equivalent circuit diagram of a pixel of an organic light emitting display device.

Referring to FIGS. 1 and 2, each pixel includes a switching thin film transistor T1, a driving thin film transistor T2, a storage capacitor Cst, and an organic light emitting diode OLED. Further, each pixel is connected to a scan line 21 for transmitting a scan signal, a data line 22 for transmitting a data signal, and a driving voltage line 23 for transmitting a driving voltage ELVDD.

The switching thin film transistor T1 includes a control terminal, an input terminal, and an output terminal. The control terminal is connected to the scan line 21, the input terminal is connected to the data line 22, and the output terminal is connected to the driving thin film transistor T2. The switching thin film transistor T1 transmits the data signal applied to the data line 22 to the driving thin film transistor T2 in response to the scan signal applied to the scan line 21.

The driving thin film transistor T2 also includes a control terminal, an input terminal, and an output terminal. The control terminal is connected to the switching thin film transistor T1, the input terminal is connected to the driving voltage line 23, and the output terminal is connected to the organic light emitting diode OLED. The driving thin film transistor T2 allows an output current Id having a level varying according to a voltage applied between the control terminal and the output terminal to flow.

The storage capacitor Cst is connected to the control terminal and the input terminal of the driving thin film transistor T2 between the control terminal and the input terminal. The storage capacitor Cst charges the data signal applied to the control terminal of the driving thin film transistor T2 and maintains the charged data signal even after the switching thin film transistor T1 is turned off.

The organic light emitting diode OLED includes an anode connected to the output terminal of the driving thin film transistor T2, a cathode connected to a common voltage ELVSS, and an organic emission layer formed between the anode and the cathode. The organic light emitting diode OLED emits light with a level varying according to an output current of the driving thin film transistor T2. The configuration of the pixel of the display unit 20 is not limited to the aforementioned example, and a separate thin film transistor and a separate capacitor may be added as necessary.

Figure 3:
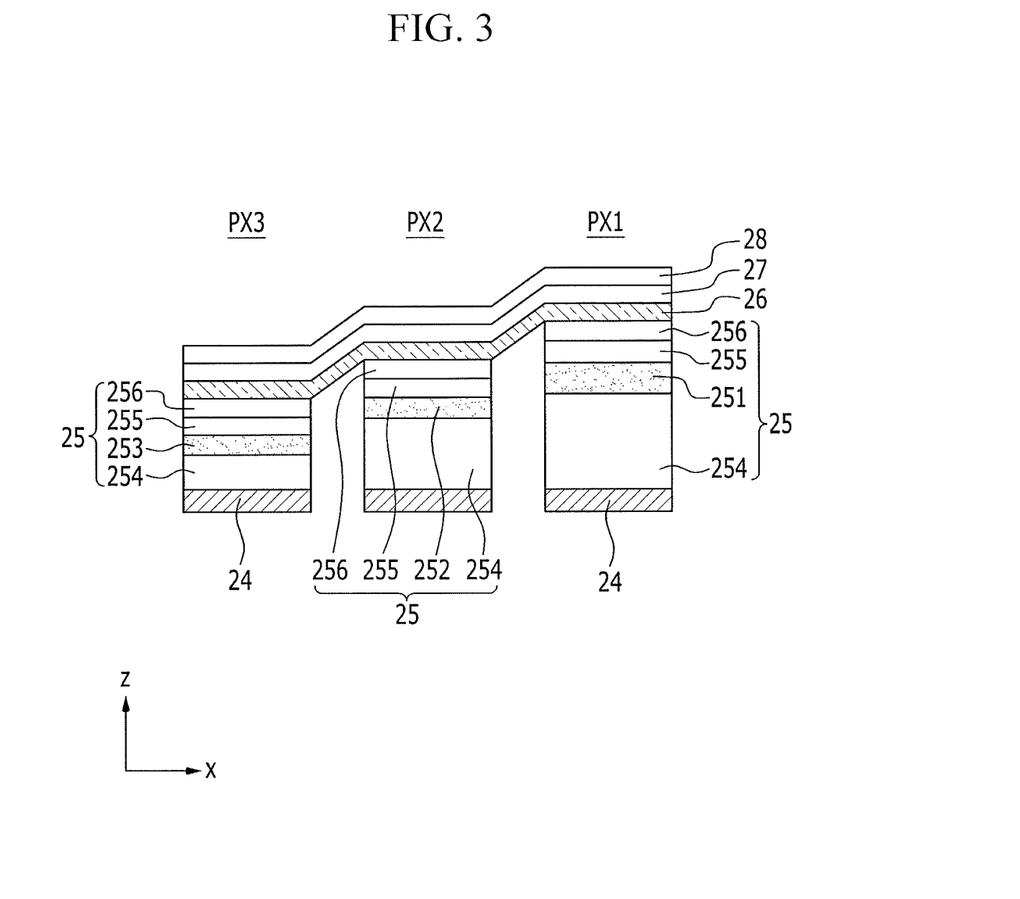
FIG. 3 illustrates an enlarged cross-sectional view of an organic light emitting diode illustrated in FIG. 2.

The display unit 20 includes a plurality of pixels, e.g., the first pixel PX1, the second pixel PX2, and the third pixel PX3, of which emission colors are different from each other, in order to express full color. For example, the first pixel PX1, the second pixel PX2, and the third pixel PX3 may be a red pixel, a green pixel, and a blue pixel, respectively. FIG. 3 is an enlarged cross-sectional view of the organic light emitting diode OLED illustrated in FIG. 2.

Referring to FIG. 3, each of the first pixel PX1, the second pixel PX2, and the third pixel PX3 includes an anode 24, an organic emission layer 25, and a cathode 26. The anode 24 is a pixel electrode, and is connected with a driving thin film transistor of a corresponding pixel. The cathode 26 is a common electrode and is formed on the entire display unit 20 regardless of the pixel. The organic emission layer 25 includes emission layers 251, 252, and 253, and further includes at least one of a hole injecting layer, a hole transporting layer, an electron transporting layer, and an electron injecting layer.

The hole injecting layer and the hole transporting layer are formed between the anode 24 and the emission layers 251, 252, and 253, and the electron transporting layer and the electron injecting layer are formed between the emission layers 251, 252, and 253 and the cathode 26. In FIG. 3, it is illustrated that the organic emission layer 25 includes a hole injecting layer 254, the emission layers 251, 252, and 253, an electron transporting layer 255, and an electron injecting layer 256 as an example.

The emission layer (the first emission layer 251) of the first pixel PX1, the emission layer (the second emission layer 252) of the second pixel PX2, and the emission layer (the third emission layer 253) of the third pixel PX3 may be a red emission layer, a green emission layer, and a blue emission layer, respectively.

When the display device 100 is a top emission type, the anode 24 is formed as a reflective layer, and the cathode 26 is formed as a semi-transparent layer. The reflective layer may include, e.g., at least one of Au, Ag, Mg, Al, Pt, Pd, Ni, Nd, Ir, and Cr. The semi-transparent layer may be formed as a metal thin film including, e.g., at lest one of Li, Ca, LiF/Ca, LiF/Al, Al, Ag, Mg, and the like, and a transparent layer, e.g., at least one of indium tin oxide (ITO), an indium zinc oxide (IZO), ZnO, and $In_2O_3$, may be formed on the semi-transparent layer.

Light emitted from the emission layers 251, 252, and 253 is reflected from the anode 24, and passes through the cathode 26 to be discharged to the outside. In this case, the cathode 26 is formed as a semi-transparent layer, so that some of the light reaching the cathode 26 is reflected back to the anode 24 again. Accordingly, light emitted from the emission layers 251, 252, and 253 causes intensive resonance between the anode 24 and the cathode 26, thereby improving efficiency in light extraction.

A distance between the anode 24 and the cathode 26, which cause intensive resonance, varies according to a wavelength of light emitted from the emission layers 251, 252, and 253. Accordingly, the organic emission layers 25 in the first to third pixels PX1, PX2, and PX3 are formed with different thicknesses, so that a distance between the anode 24 and the cathode 26 is optimized for each color of the emission layers 251, 252, and 253. For example, the organic emission layers 25 are formed to be thick in an order of the first pixel PX1, the second pixel PX2, and the third pixel PX3, so that a distance between the anode 24 and the cathode 26 may be increased.

A capping layer 27 may be formed on the cathode 26. The capping layer 27 performs a function of protecting the organic light emitting diode OLED and optimizing light efficiency by matching a refractive index. The capping layer 27 may include an organic material, e.g., α-NPD(N,N'-di (naphthalene-1-yl)-N,N'-diphenyl benzidine, NPB(N,N'-dephenyl-N,N'-bis(1-naphthyl)-(1,1'-biphenyl)-4,4'-diamine), TPD(N,N'-bis(3-methylphenyl)-N,N-diphenyl-[1,1-biphenyl]-4,4'-diamine), m-MTDATA(thriphenylamine), Alq3 (tris-8-hydroxyquinoline aluminum), or CuPc(copper phthalocyanine).

A blocking layer 28 may be formed on the capping layer 27. The blocking layer 28 may include an inorganic material, e.g., LiF, $MgF_2$, and $CaF_2$, and may prevent the organic light emitting diode OLED from being damaged due to plasma used in a process of forming an inorganic layer of the sealing part 30. The blocking layer 28 may have a function of optimizing light efficiency by matching a refractive index, similar to the capping layer 27. The blocking layer 28 may be formed of, e.g., LiF having a pin hole structure.

Referring to FIGS. 1 and 3, the sealing part 30 for covering and sealing the display unit 20 is formed on the blocking layer 28. The sealing part 30 may be formed of a film encapsulation including a laminated structure of an inorganic layer and an organic layer. In FIG. 1, it is illustrated that the sealing part 30 includes a first inorganic layer 31, a first organic layer 32, a second inorganic layer 33, a second organic layer 34, and a third inorganic layer 35 as an example, but the sealing part 30 is not limited to the illustrated structure.

The inorganic layers 31, 33, and 35 serve to restrict moisture and oxygen from permeating, and the organic layers 32 and 34 serve to relieve stress of the inorganic layers 31, 33, and 35 and fill micro cracks, pin holes, and the like of the inorganic layers 31, 33, and 35. The inorganic layers 31, 33, and 35 may include, e.g., $Al_2O_3$, $SiN_x$, and the like, and may be formed by sputtering or chemical vapor deposition. The organic layers 32 and 34 are formed with larger thicknesses than those of the inorganic layers 31, 33, and 35, and serve as planarizing layers for removing steps of the pixels under the sealing part 30, e.g., the organic layers 32 and 34 of the sealing part 30 may planarize the stepped structure of the pixels PX1 through PX3 in FIG. 3 to ensure that an uppermost surface of the sealing part 30 is parallel to the substrate 10 in its entirety. The organic layers 32 and 34 may include, e.g., epoxy, acrylate, urethane acrylate, and the like.

The sealing part 30 may also be formed of an encapsulation substrate (not illustrated), instead of the aforementioned film encapsulation. The encapsulation substrate may be formed of the same material as that of the substrate 10, and may be integrally fixed to the substrate 10 by a sealant (not illustrated). The sealant is formed in a frame shape in a non-display area outside the display area, and a filler (not illustrated) may be formed at an inner space of the sealant.

The touch sensor 40 may be formed on the sealing part 30, e.g., the touch sensor 40 may be formed directly on an uppermost layer of the sealing part 30. The touch sensor 40 is formed between the emission layers 251, 252, and 253 while corresponding to the emission layers 251, 252, and 253 so as not to hide light of the emission layers 251, 252, and 253. That is, each portion of the touch sensor 40 may be positioned between two emission layers of corresponding pixels adjacent to each other along a horizontal direction, e.g., a portion of the touch sensor 40 may be between the emission layers 251 and 252 of the first and second pixels PX1 and PX2, respectively, to as not to hide light emitted from the emission layers. In detail, the touch sensor 40 may include the detection electrodes 41 and 42 shaped like a mesh surrounding each of the first to third emission layers 251, 252, and 253. The detection electrodes 41 and 42 may include a low-resistance metal, e.g., Ag, Al, Cu, Cr, and Ni, or a nano conductive material, e.g., an Ag nanowire and a carbon nanotube (CNT).

The aforementioned detection electrodes 41 and 42 have lower resistance than detection electrode formed of a transparent conductive layer, thereby reducing an RC delay. Further, the detection electrodes 41 and 42 have excellent flexibility, so that a crack is not easily generated even due to repeated deformation, e.g., bending.

The cover window 60 for protecting the display unit 20 and the touch sensor 40 is formed on the touch sensor 40. The polarizer 50 for decreasing reflection of external light may be positioned between the display unit 20 and the cover window 60. FIG. 1 illustrates an example in which the polarizer 50 is positioned between the touch sensor 40 and the cover window 60, and reference numeral 70 denotes an adhesive layer for bonding the polarizer 50 and the cover window 60.

Figure 4:
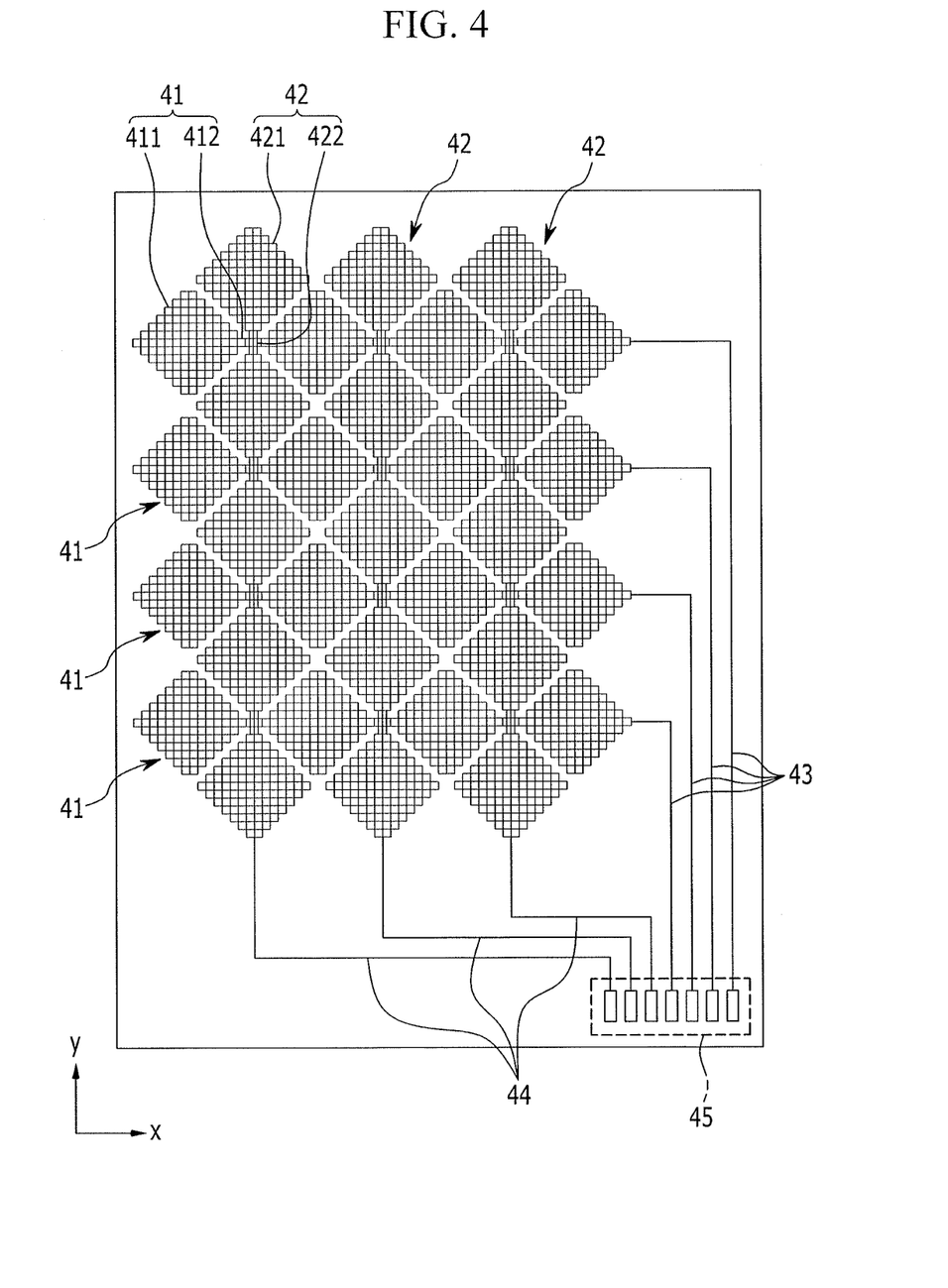
FIG. 4 illustrates a top plan view of a touch sensor illustrated in FIG. 1.
Figure 5:
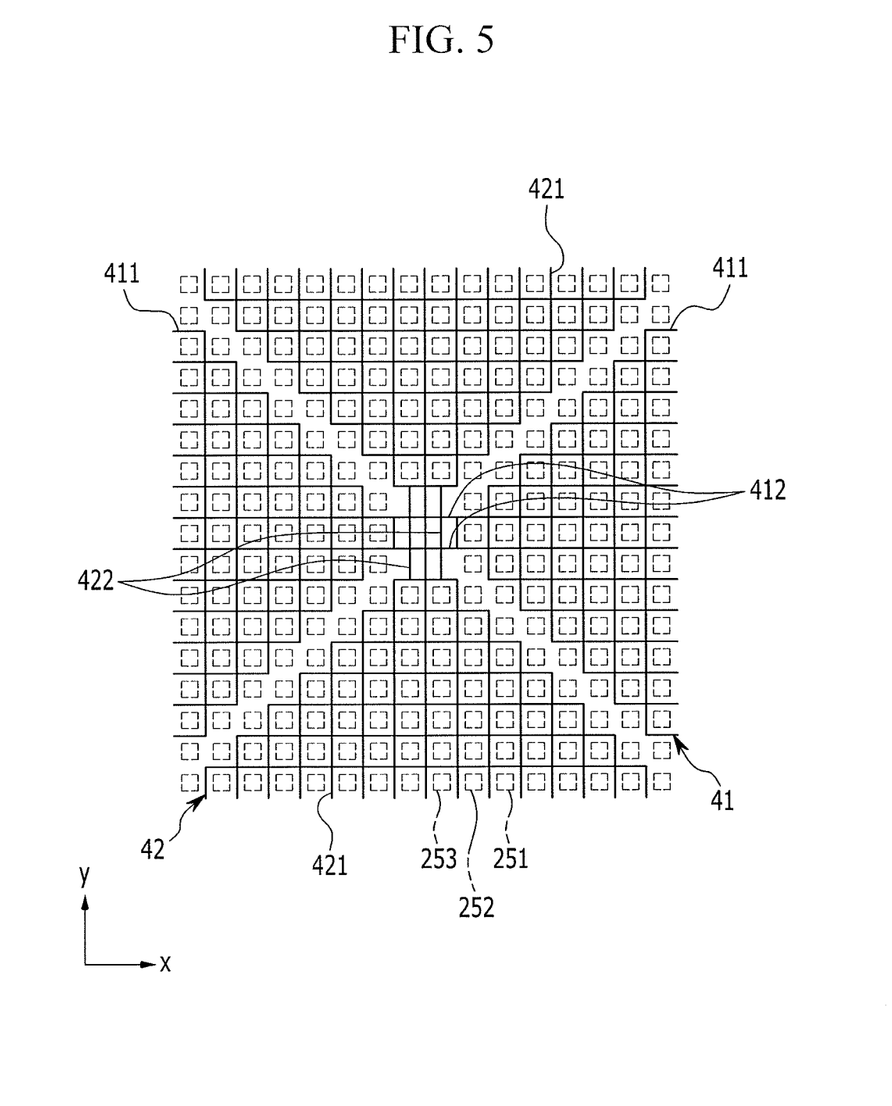
FIG. 5 illustrates a partially enlarged view of FIG. 4.

FIG. 4 is a top plan view of the touch sensor 40, and FIG. 5 is a partially enlarged view of FIG. 4.

Referring to FIGS. 4 and 5, the detection electrodes 41 and 42 of the touch sensor 40 include a plurality of first detection electrodes 41 formed in parallel in a first direction (x-axis direction), and a plurality of second detection electrodes 42 formed in parallel in a second direction (y-axis direction). The first direction and the second direction cross each other. The plurality of first detection electrodes 41 is connected with a pad part 45 by first lead lines 43, and the plurality of second detection electrodes 42 is connected with the pad part 45 by second lead lines 44.

Each first detection electrode 41 includes a plurality of first detection cells 411 arranged in the first direction, and a plurality of first connection patterns 412 for connecting adjacent first detection cells 411. Each second detection electrode 42 includes a plurality of second detection cells 421 arranged in the second direction, and a plurality of second connection patterns 422 for connecting adjacent second detection cells 421. The first detection cells 411 and the second detection cells 421 are formed while having a distance therebetween so as to prevent the first detection cells 411 and the second detection cells 421 from being in contact with each other or overlapping each other.

The first detection cells 411 and the second detection cells 421 may have a diamond shape, and the first connection patterns 412 and the second connection patterns 422 may be formed in a plurality of lines. However, the shapes of the detection cells 411 and 421 and the connection patterns 412 and 422 are not limited to the illustrated examples, and are variously modified. Each of the first detection cells 411 and the second detection cells 421 may be formed in a mesh shape (solid line in FIG. 5) surrounding each of the first to third emission layers 251, 252, and 253 (dashed line in FIG. 5).

A touch controller (not illustrated) connected with the first and second lead lines 43 and 44 may input a detection input signal into at least one of the first detection electrode 41 and the second detection electrode 42, receive a detection output signal, and detect a position of the touch. A touch position detecting method may include a self-capacitance method, a mutual capacitance method, and the like. The touch controller may detect a change in capacitance of the first detection electrode 41 and/or the second detection electrode 42 according to a touch of a user to detect a position of the touch.

Figure 6:
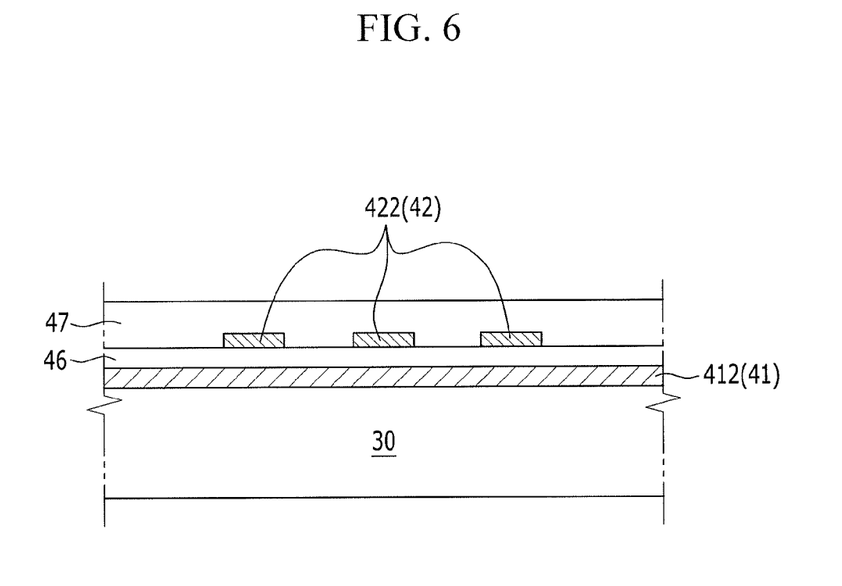
FIG. 6 illustrates a cross-sectional view of a crossing portion of a first connection pattern and a second connection pattern in the touch sensor in FIG. 5.

FIG. 6 is a cross-sectional view illustrating an intersection of the first connection pattern 412 and the second connection pattern 422 in the touch sensor 40.

Referring to FIGS. 1 and 6, the first detection electrode 41 is formed on the sealing part 30, and a first insulating layer 46 is formed on an entire surface of the sealing part 30 or partially formed on the first connection pattern 412. Then, the second detection electrode 42 is formed, and a second insulating layer 47 is formed on the entire sealing part 30. The first connection pattern 412 and the second connection pattern 422 are insulated from each other by the first insulating layer 46, and all of the first detection electrode 41 and the second detection electrode 42 are covered and protected by the second insulating layer 47. The first and second insulating layers 46 and 47 may include, e.g., $SiN_x$.

Figure 7:
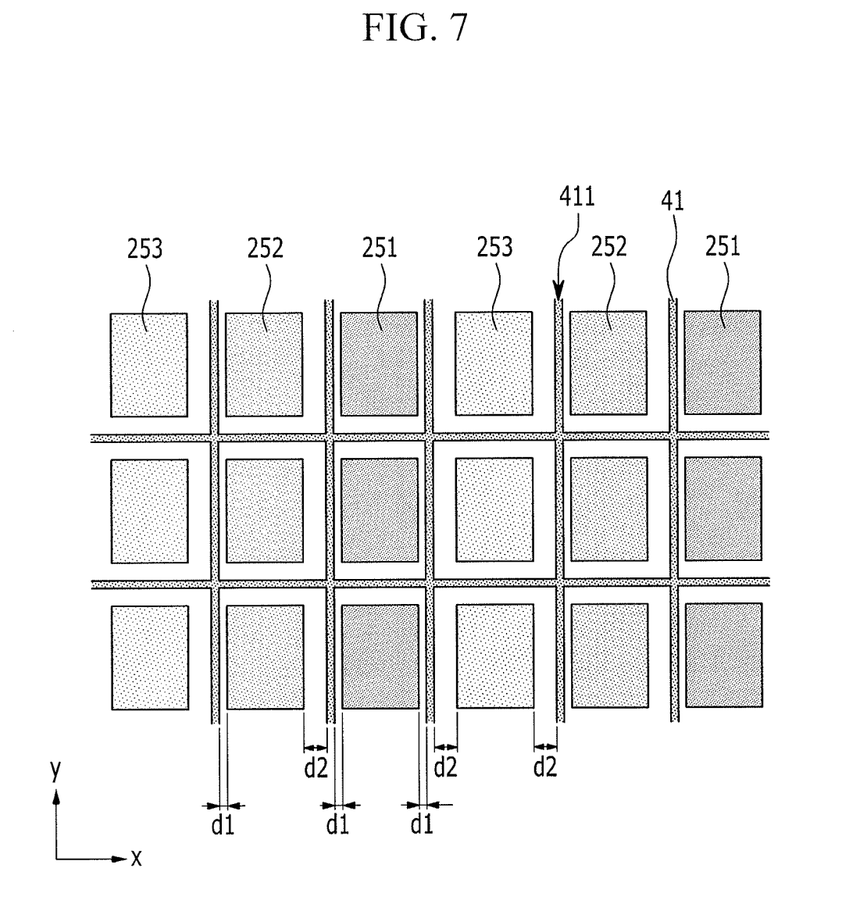
FIG. 7 illustrates a partially enlarged view of FIG. 5.

FIG. 7 is a partially enlarged view of FIG. 5, and illustrates a portion of one first detection cell 411 surrounding first to third emission layers 251, 252, and 253. The second detection cell 421 is formed in the same shape as that of the first detection cell 411, so that a repeated description will be omitted.

Referring to FIG. 7, first to third emission layers 251, 252, and 253 are arranged in an approximate matrix form while corresponding to the pixel arrangement. For example, emission layers with different colors are alternately formed in the first direction, and emission layers with a same color are formed in parallel in the second direction.

In FIG. 7, it is illustrated that the third emission layer 253, the second emission layer 252, and the first emission layer 251 are sequentially arranged in the first direction as an example, but an arrangement order of the emission layers is not limited to the illustrated example. Further, FIG. 7 illustrates that all of the first to third emission layers 251, 252, and 253 are formed with a same size, but a specific emission layer may be formed to be larger than other emission layers according to light emission efficiency.

The entire first detection electrode 41 is formed with a predetermined width, and maintains different distances from the first emission layer 251, the second emission layer 252, and the third emission layer 253 in a surface direction of the substrate 10, e.g., along the x-axis. That is, the first detection electrode 41 maintains a different distance from each of the first emission layer 251, the second emission layer 252, and the third emission layer 253 in the first direction, i.e., in the x-axis direction, in which the emission layers with the different colors are alternately arranged.

In detail, a distance d1 between the first emission layer 251 and the first detection electrode 41 in the first direction is smaller than a distance d2 between the third emission layer 253 and the first detection electrode 41 in the first direction. That is, the first detection electrode 41 is positioned to be closer to the first emission layer 251 than to the third emission layer 253. The distances d1 between the first emission layer 251 and the first detection electrode 41 may be the same at a left side and a right side of the first emission layer 251, and the distances d2 between the third emission layer 253 and the first detection electrode 41 may be the same at a left side and a right side of the third emission layer 253.

Distances between the second emission layer 252 and the first detection electrode 41 in the first direction may be different at a left side and a right side of the second emission layer 252. The distance between the second emission layer 252 and the first detection electrode 41 at one side of the second emission layer 252 may be the same as d1, and the distance between the second emission layer 252 and the first detection electrode 41 at the other side of the second emission layer 252 may be the same as d2.

The first emission layer 251, the second emission layer 252, and the third emission layer 253 are formed at different heights, i.e., at different vertical distances along the z-axis from the anode 24 (see FIG. 3), so that all of the distances (vertical distances) to the touch sensor 40 are different. The first detection electrode 41 is positioned farthest from the third emission layer 253 having the largest vertical distance in the first direction, and is positioned closest to the first emission layer 251 having the smallest vertical distance in the first direction. That is, a vertical distance between the first detection electrode 41 and the third emission layer 253 is larger than the vertical distances between the first detection electrode 41 and each of the first and second emission layers 251 and 252.

Accordingly, the touch sensor 40 may considerably decrease a hiding phenomenon of the third emission layer 253 according to a change in a viewing angle, thereby restricting a change in luminance and a color shift phenomenon causing a problem of bruising or moiré. Further, the third emission layer 253 (the blue emission layer) has a color which is relatively more difficult to be recognized than red and green according to a structure of the eyes of a person, so that the touch sensor 40 having the aforementioned structure effectively improves recognition of the third emission layer 253.

Figure 8:
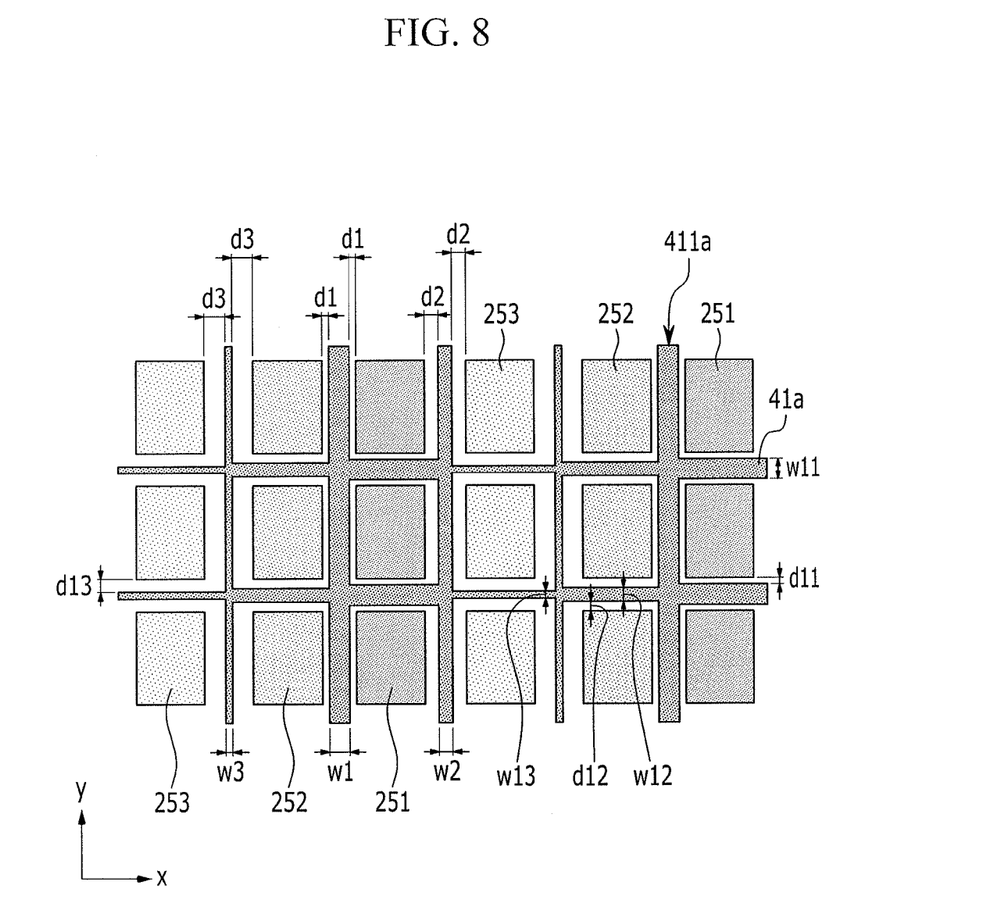
FIG. 8 illustrates a schematic diagram of a display device according to a second exemplary embodiment.

FIG. 8 is a schematic diagram of a display device according to a second exemplary embodiment. FIG. 8 illustrates an enlarged portion of a first detection cell with the first to third emission layers. The remaining elements and configurations, except for a touch sensor, in the display device of the second exemplary embodiment are the same as those of the first exemplary embodiment, so repeated descriptions will be omitted. A second detection cell (not illustrated) has the same shape as that of the first detection cell.

Referring to FIG. 8, a first detection electrode 41a is formed to have at least three different widths, and maintains different distances from the first emission layer 251, the second emission layer 252, and the third emission layer 253 in the surface direction of the substrate 10, i.e., in both the first direction (x-direction) and the second direction (y-axis direction). In detail, the first detection electrode 41a may have a first detection cell 411a with a largest width w1 between the first emission layer 251 and the second emission layer 252, with a middle width w2 between the first emission layer 251 and the third emission layer 253, and a smallest width w3 between the second emission layer 252 and the third emission layer 253. In this case, the first detection electrode 41a may maintain the same distance from the two adjacent emission layers in the first direction.

Distances between each of the first to third emission layers 251, 252, and 253 and the first detection electrodes measured at the left side and the right side of each of the first to third emission layers 251, 252, and 253 are different from each other by a change in a width of the first detection electrode 41a. In detail, the first emission layer 251 maintains an interval d1 with the first detection electrode 41a at the left side, and an interval d2 with the first detection electrode 41a at the right side. The second emission layer 252 maintains an interval d3 with the first detection electrode 41a at the left side, and the interval d1 with the first detection electrode 41a at the right side. The third emission layer 253 maintains an interval d2 with the first detection electrode 41a at the left side, and the interval d3 with the first detection electrode 41a at the right side. The distances d1, d2, and d3 satisfy a condition of d3>d2>d1.

Further, the first detection electrode 41a may be formed with a largest width w11 between adjacent first emission layers 251, with a middle width w12 between adjacent second emission layers 252, and a smallest width w13 between adjacent third emission layers 253. Width w11 may be the same as width w1, width w12 may be the same as width w2, and width w13 may be the same as width w3. In this case, the first detection electrode 41a maintains the same distance from the two adjacent emission layers in the second direction. In detail, the first emission layer 251, the second emission layer 252, and the third emission layer 253 maintain intervals d11, d12, and d13 with the first detection electrode 41s in the second direction, respectively, while distances d11, d12, d13 satisfy a condition of d13>d12>d11.

As described above, the first detection electrode 41a is formed with the smallest width around the third emission layer 253 with respect to the third emission layer 253 having the largest vertical distance from the touch sensor 40, and is positioned farthest from the third emission layer 253. Further, the first detection electrode 41a is formed with the largest width around the first emission layer 251 with respect to the first emission layer 251 having the smallest vertical distance from the touch sensor 40, and is positioned closest to the first emission layer 251. Accordingly, the touch sensor of the second exemplary embodiment may also considerably decrease a hiding phenomenon of the third emission layer 253 due to a change in a viewing angle, thereby restricting a change in luminance and a color shift phenomenon.

Figure 9:
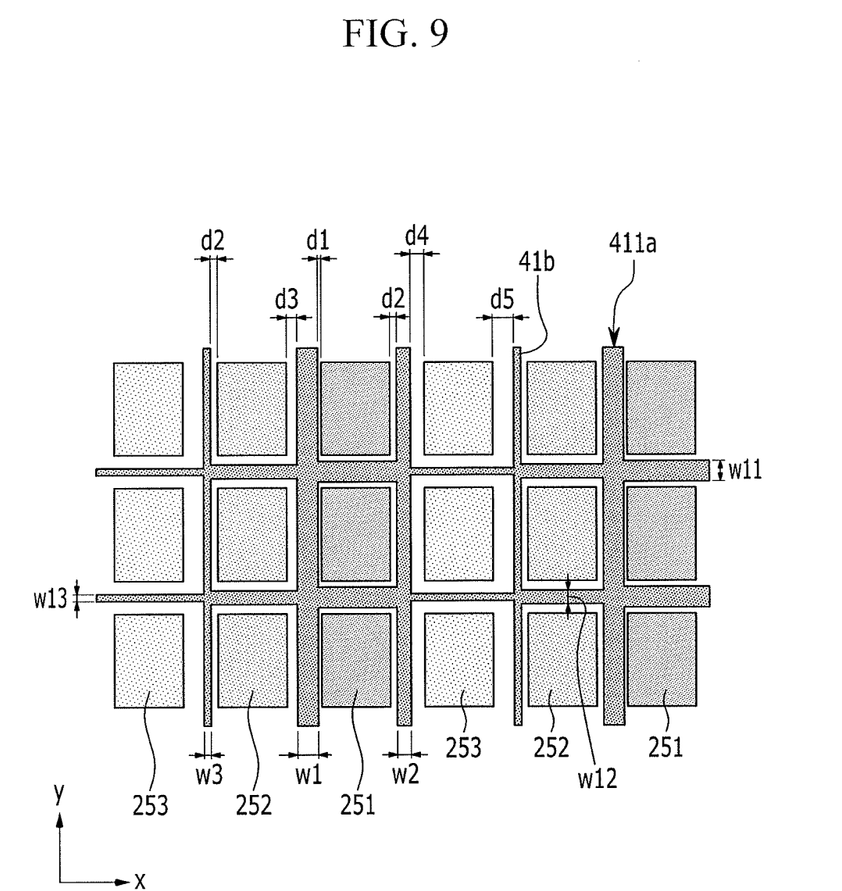
FIG. 9 illustrates a schematic diagram of a display device according to a third exemplary embodiment.

FIG. 9 is a schematic diagram of a display device according to a third exemplary embodiment. FIG. 9 illustrates an enlarged portion of a first detection cell with the first to third emission layers. The display device of the third exemplary embodiment has the same configuration as that of the aforementioned second exemplary embodiment, except for having a first detection electrode 41b angled, i.e., inclined, toward any one having a small vertical distance from the touch sensor 40 between two adjacent emission layers in the first direction (x-axis direction).

Referring to FIG. 9, the first detection electrode 41b may be formed with the largest width w1 between the first emission layer 251 and the second emission layer 252, with the middle width w2 between the first emission layer 251 and the third emission layer 253, and the smallest width w3 between the second emission layer 252 and the third emission layer 253. In this case, the first detection electrode 41b between the first emission layer 251 and the second emission layer 252 is positioned closer to the first emission layer 251 than to the second emission layer 252. That is, the first detection electrode 41b is positioned closer to the first emission layer 251, which has a smaller vertical distance from the touch sensor 40, between the first emission layer 251 and the second emission layer 252.

Similarly, the first detection electrode 41b between the first emission layer 251 and the third emission layer 253 is positioned closer to the first emission layer 251 than to the third emission layer 253, and the first detection electrode 41b between the second emission layer 252 and the third emission layer 253 is positioned closer to the second emission layer 252 than to the third emission layer 253. That is, when the emission layer has a large vertical distance from the touch sensor 40, the first detection electrode 41 is formed to be far from the emission layer in the first direction.

In detail, the first emission layer 251 may maintain an interval d1 with the first detection electrode 41b at a left side, and an interval d2 with the first detection electrode 41b at a right side. The second emission layer 252 may maintain an interval d2 with the first detection electrode 41*b* at a left side, and an interval d3 with the first detection electrode 41*b* at a right side. The third emission layer 253 may maintain an interval d4 with the first detection electrode 41*b* at a left side, and an interval d5 with the first detection electrode 41*b* at a right side. Intervals d1, d2, d3, d4, and d5 may satisfy a condition of d5>d4>d3>d2>d1.

Further, the first detection electrode 41*b* may be formed with the largest width w11 between the first emission layers 251, with the middle width w12 between the second emission layers 252, and the smallest width w13 between the third emission layers 253. Width w11 may be the same as width w1, width w12 may be the same as width w2, and width w13 may be the same as width w3. In this case, the first detection electrode 41*b* may maintain the same distance from the two adjacent emission layers in the second direction (y-axis direction).

As described above, the first detection electrode 41*b* is formed with the smallest width around the third emission layer 253 with respect to the third emission layer 253 having the largest vertical distance from the touch sensor 40, and is positioned farthest from the third emission layer 253. Accordingly, the touch sensor of the third exemplary embodiment may also considerably decrease a hiding phenomenon of the third emission layer 253 due to a change in a viewing angle, thereby restricting a change in luminance and a color shift phenomenon.

By way of summation and review, conventional detection electrodes of the capacitive type touch sensor may be formed by a transparent conductive layer, e.g., indium tin oxide (ITO). However, while the transparent conductive layer has excellent light transmittance and electrical conductivity, it is easily damaged when external force causing deformation is applied. Accordingly, when a flexible display device with conventional transparent detection electrodes is repeatedly curved or bent, cracks may be generated in the detection electrodes, thereby causing an operation problem.

It is possible to form detection electrodes as a mesh type electrodes by patterning an opaque conductive material, e.g., metal, in a mesh shape, instead of the transparent conductive layer. Such a mesh type electrode may be positioned between pixels so as not to hide the pixels included in a display panel, e.g., emission layers, and may be formed with a width smaller than a distance between the pixels.

For example, in an organic light emitting display device, a red pixel, a green pixel, and a blue pixel adopt a micro cavity structure in order to improve efficiency of light extraction. In this case, a red emission layer, a green emission layer, and a blue emission layer are formed to have different heights, and as a result, vertical distances in a thickness direction between the mesh type electrode and each of the red emission layer, the green emission layer, and the blue emission layer may also be different from each other.

Figure 10:
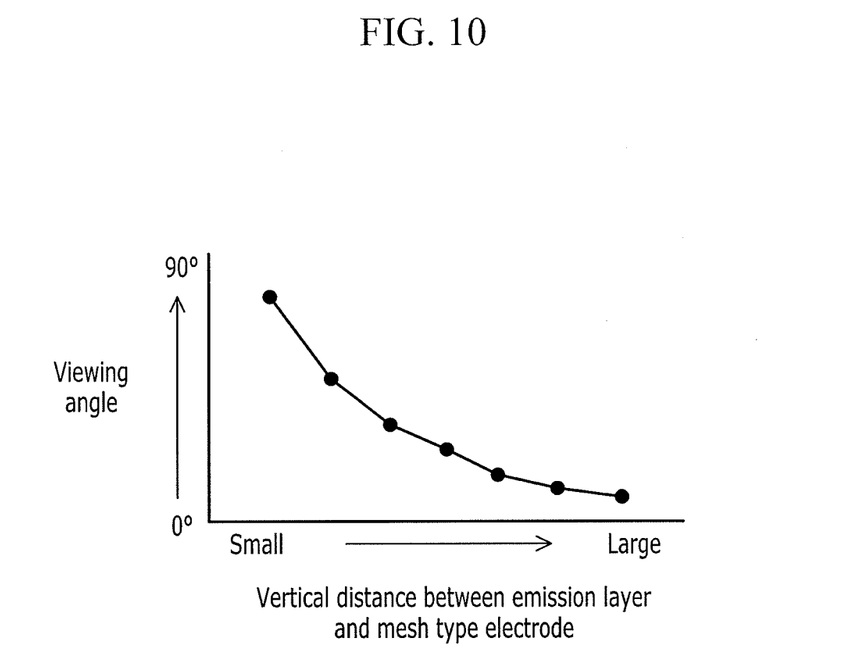
FIG. 10 illustrates a graph schematically illustrating an emission layer hiding phenomenon according to a distance between an emission layer and a mesh type electrode and a change in a viewing angle.

However, as a distance between an emission layer and the mesh type electrode is increased, the mesh type electrode hides the emission layer even within a small change in a viewing angle. For example, dots in FIG. 10 represent minimum viewing angles at which an emission layer hiding phenomenon occurs at a specific distance on a horizontal axis.

Therefore, according to example embodiments, display device includes a touch sensor with a mesh type electrode, which restricts an emission layer hiding phenomenon according to a change in a viewing angle, thereby minimizing deterioration of an image quality. That is, the touch sensor includes a mesh type electrode with varying horizontal distances between the mesh type electrode and the different emission layers, in order to reduce a hiding phenomenon of a specific emission layer according to a change in a viewing angle. As such, a change in luminance and a color shift phenomenon may be minimized. As a result, the display device of the present exemplary embodiments may prevent an image quality from deteriorating due to bruising, moiré, and the like.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display device, comprising:
   a substrate;
   a display unit on the substrate, the display unit including a first emission layer, a second emission layer, and a third emission layer having different emission colors;
   a sealing part covering and sealing the display unit; and
   a touch sensor on the sealing part, the touch sensor including a detection electrode adjacent to the first emission layer, the second emission layer, and the third emission layer, and the detection electrode maintaining different distances from each of the first emission layer, the second emission layer, and the third emission layer in a surface direction of the substrate.

2. The display device as claimed in claim 1, wherein the first emission layer, the second emission layer, and the third emission layer are at different heights from the substrate and have different vertical distances from the touch sensor in a thickness direction of the substrate.

3. The display device as claimed in claim 2, wherein:
   the first emission layer, the second emission layer, and the third emission layer are alternately arranged in a first direction of the substrate; and
   the detection electrode maintains different distances from the first emission layer, the second emission layer, and the third emission layer in the first direction.

4. The display device as claimed in claim 3, wherein:
   the vertical distance from the touch sensor increases in an order from the third emission layer, to the second emission layer, and to the first emission layer, and
   the detection electrode maintains a large distance in an order of the third emission layer, the second emission layer, and the first emission layer in the first direction.

5. The display device as claimed in claim 4, wherein the entire detection electrode has a predetermined width.

6. The display device as claimed in claim 4, wherein the detection electrode includes portions having at least three different widths.

7. The display device as claimed in claim 6, wherein the detection electrode has a first width w1 between the first emission layer and the second emission layer, a second width w2 between the first emission layer and the third emission layer, and a third width w3 between the second emission layer and the third emission layer, and satisfies a condition of w1>w2>w3.

8. The display device as claimed in claim 7, wherein the detection electrode maintains a same distance from two emission layers between the two adjacent emission layers in the first direction.

9. The display device as claimed in claim 7, wherein the detection electrode is positioned closer to any one of two emission layers having a smaller vertical distance from the touch sensor between the two adjacent emission layers in the first direction.

10. The display device as claimed in claim 7, wherein:
emission layers having a same color are arranged in a second direction which crosses the first direction, and
the detection electrode has different widths between the first emission layers, the second emission layers, and the third emission layers.

11. The display device as claimed in claim 10, wherein the detection electrode has a first width w11 between the first emission layers, a second width w12 between the second emission layers, and a third width w13 between the third emission layers, and satisfies a condition of w11>w12>w13.

12. The display device as claimed in claim 11, wherein the detection electrode maintains a same distance from two emission layers between the two adjacent emission layers in the second direction.

13. The display device as claimed in claim 2, wherein:
the sealing part has a laminated structure of at least two inorganic layers and at least one organic layer, and
the organic layer is a planarizing layer having a constant distance from a top surface thereof to the substrate.

14. The display device as claimed in claim 1, wherein the detection electrode includes:
a first detection electrode having a plurality of first detection cells and a plurality of connection patterns; and
a second detection electrode having a plurality of second detection cells and a plurality of second connection patterns, the second detection electrode crossing the first detection electrode, wherein the plurality of first detection cells and the plurality of second detection cells are connected in a mesh shape surrounding each of the first emission layer, the second emission layer, and the third emission layer.

15. The display device as claimed in claim 14, wherein the detection electrode includes at least one of silver (Ag), aluminum (Al), copper (Cu), chromium (Cr), nickel (Ni), a silver (Ag) nanowire, and a carbon nanotube.

16. A display device, comprising:
a substrate;
a display unit on the substrate, the display unit including a first emission layer, a second emission layer, and a third emission layer having different emission colors;
a sealing part covering and sealing the display unit; and
a touch sensor on the sealing part, the touch sensor including a detection electrode adjacent to the first emission layer, the second emission layer, and the third emission layer, and the detection electrode having different widths around each of the first emission layer, the second emission layer, and the third emission layer.

17. The display device as claimed in claim 16, wherein the first emission layer, the second emission layer, and the third emission layer are at different heights from the substrate and have different vertical distances from the touch sensor in a thickness direction of the substrate.

18. The display device as claimed in claim 17, wherein:
the vertical distance from the touch sensor increases in an order of the third emission layer, the second emission layer, and the first emission layer, and
the detection electrode has a smallest width around the third emission layer, and a largest width around the first emission layer.

19. The display device as claimed in claim 18, wherein the detection electrode has a same distance from two emission layers between the two adjacent emission layers.

20. The display device as claimed in claim 18, wherein the detection electrode is positioned closer to any one of two emission layers having a smaller vertical distance from the touch sensor between the two adjacent emission layers.

* * * * *